United States Patent
Nayak et al.

(10) Patent No.: US 7,332,908 B2
(45) Date of Patent: Feb. 19, 2008

(54) SSFP MRI WITH INCREASED SIGNAL BANDWIDTH

(75) Inventors: Krishna S. Nayak, Los Angeles, CA (US); Brian A. Hargreaves, San Francisco, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/381,601

(22) Filed: May 4, 2006

(65) Prior Publication Data

US 2007/0257671 A1   Nov. 8, 2007

(51) Int. Cl.
*G01V 3/00*   (2006.01)

(52) U.S. Cl. ...................... 324/307; 324/309

(58) Field of Classification Search ............... 324/307, 324/309
See application file for complete search history.

(56) References Cited

U.S. PATENT DOCUMENTS

| | | | |
|---|---|---|---|
| 4,769,603 A | 9/1988 | Oppelt et al. | |
| 5,541,514 A | 7/1996 | Heid et al. | |
| 6,339,332 B1 | 1/2002 | Deimling | |
| 6,608,479 B1 * | 8/2003 | Dixon et al. | ............... 324/307 |

OTHER PUBLICATIONS

Nayak et al., "Wideband SSFP: SSFP with Imaging Bandwidth Greater than 1/TR", Poster, ISMRM, May 8, 2005, Miami FL.
Nayak et al., "Wideband SSFP: SSFP with Imaging Bandwidth Greater than 1/TR", Proc. Intl. Soc. Mag. Reson. Med. 13 (2005), May 8, 2005. Available to Attendees with Password on internet on Apr. 22, 2005.
Oppelt et al., "FISP—A New Fast MRI Sequence", Electromedia 54: 15, 1986.
Herzka et al., "Multishot EPI-SSFP in the Heart", MRM 47(4):655-664, 2002.
Nayak et al., "Spiral Balanced Steady-State Free Precession Cardiac Imaging", MRM 53:1468-1473 (2005).
Leupold et al., "Fast Fat Saturation for Balanced SSFP Imaging at Low Flip Angles using Alternating TR", 12th ISMRM, p. 266, 2004.
Hardy et al., "Steady-State Free Precession Imaging with Inherent Fat Suppression", 10th ISMRM, p. 473, 2002.
Patz et al., "Missing Pulse Steady-State Free Precession", MRM 10:194-209, 1989.

* cited by examiner

*Primary Examiner*—Louis M. Arana
(74) *Attorney, Agent, or Firm*—Beyer Weaver LLP

(57) ABSTRACT

Disclosed is a wideband SSFP, wherein a standard balanced SSFP MRI sequence is played with repetition times of alternating lengths, TR and $TR_s$, where $TR_s<TR$. The result is significantly improved tradeoff between signal bandwidth and available acquisition interval lengths. This is particularly important as it enables the combination of balanced SSFP with high field imaging for many applications such as cardiac, musculoskeletal and abdominal imaging.

15 Claims, 4 Drawing Sheets conventional
(6ms, 6ms)

wideband
(6ms, 3ms)

Δf

SSFP MRI WITH INCREASED SIGNAL BANDWIDTH

STATEMENT REGARDING FEDERALLY SPONSORED RESEARCH OR DEVELOPMENT

The U.S. government has rights in the claimed invention pursuant to NIH Grant No. HL074332 to Stanford University and the University of Southern California, and NIH Grant Nos. EB002524, HL068161, HL075803, and HL039297 to Stanford University. This research was also supported by American Heart Association Grant No. 0435249N to the University of Southern California.

BACKGROUND OF THE INVENTION

This invention relates generally to magnetic resonance imaging (MRI), and more particularly the invention relates to steady state free precession (SSFP) MRI with increased signal bandwidth.

Magnetic resonance imaging (MRI) requires placing an object to be imaged in a static magnetic field, exciting nuclear spins in the object within the magnetic field, and then detecting signals emitted by the excited spins as they precess within the magnetic field. Through the use of magnetic gradient and phase encoding of the excited magnetization, detected signals can be spatially localized in three dimensions.

Magnetic resonance imaging (MRI) is a widely used medical imaging modality that provides excellent soft-tissue contrast with arbitrary scan-volume orientations. Unlike X-ray computed-tomography or ultrasound, whose contrast is based only the transmission or reflection properties of tissue, MRI generates contrast from a variety of physical properties of tissues including relaxation, chemical-shift, diffusion and proton density. However, the primary limitation for many clinical applications of MRI, including cardiac MRI, is an insufficient signal-to-noise ratio (SNR) and/or insufficient contrast-to-noise ratio (CNR).

Over the last decade two advances in MRI show potential to significantly address the SNR and CNR limitations. First, high-field systems, specifically at 3.0 T and higher provide nearly a factor of 2 increase in signal due to increased polarization compared with standard 1.5 T systems. Second, fast gradient systems enable balanced steady-state free-precession (SSFP) imaging, which independently provides increases on the order of 50% in SNR and 100% in CNR for cardiac imaging. Unfortunately, balanced SSFP imaging is very sensitive to resonance frequency variations, demanding a very short sequence repetition time (TR) which does not allow a sufficient imaging window for adequate spatial resolution. The effects of resonance frequency variations are more pronounced at 3.0 T compared with 1.5 T. A short TR competes with many aspects of sequence design, including maximizing spatial resolution, maximizing imaging efficiency, and reducing RF power deposition This invention describes a simple, yet very effective approach that allows a much longer TR, and imaging window than standard balanced SSFP while maintaining a reasonable level of sensitivity to resonance frequency variations caused by susceptibility and main field inhomogeneity.

SUMMARY

Steady state free precession imaging requires a refocused gradient sequence along with a single RF excitation, which is repeated periodically over a fixed repetition time, TR. A steady state echo is readout during each TR at an echo time typically, but not necessarily, TR/2.

In accordance with the invention, bandwidth and image resolution of the readout signal is increased by using at least two alternating repetition times for the gradient and excitation sequences. Multiple different echoes are formed with at least one echo having a wider and flatter signal passband compared to conventional SSFP, which is suitable for imaging situations where susceptibility variations or other sources of off-resonance would otherwise prevent the use of SSFP.

In specific applications, the shorter of the two repetition times can additionally be used for obtaining a field map or for navigator echoes while the longer repetition time is used to acquire the imaging signal with broader bandwidth and improved image resolution.

The invention and object and features thereof will be more readily apparent from the following detailed description and appended claims when taken with the drawings.

DETAILED DESCRIPTION OF ILLUSTRATIVE EMBODIMENTS

Figure 1:
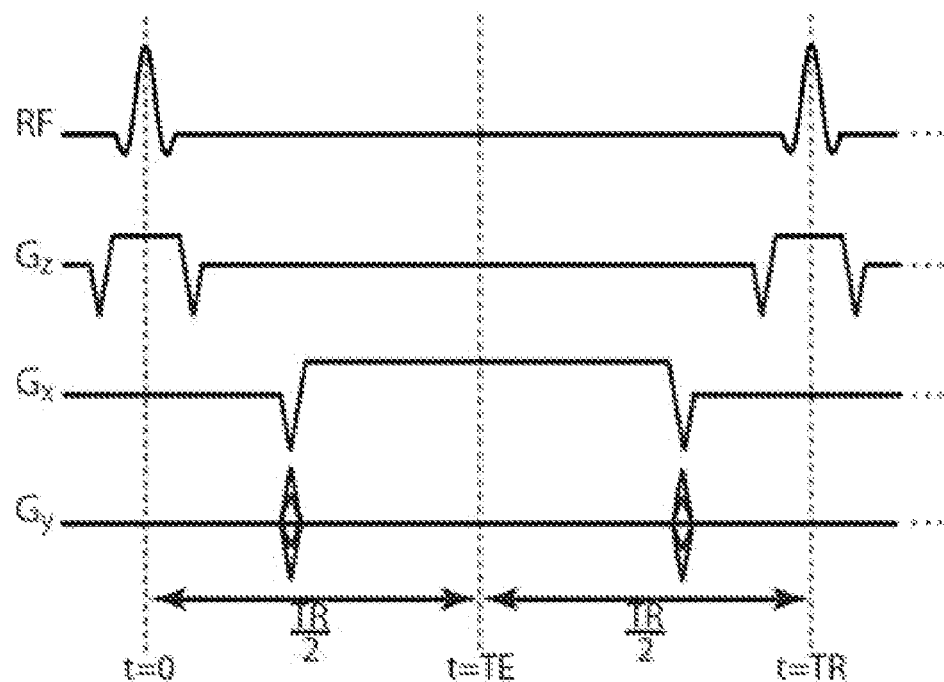
FIGS. 1 and 2 illustrate a conventional SSFP phase sequence and repetitive application thereof in accordance with the prior art.
Figure 2:
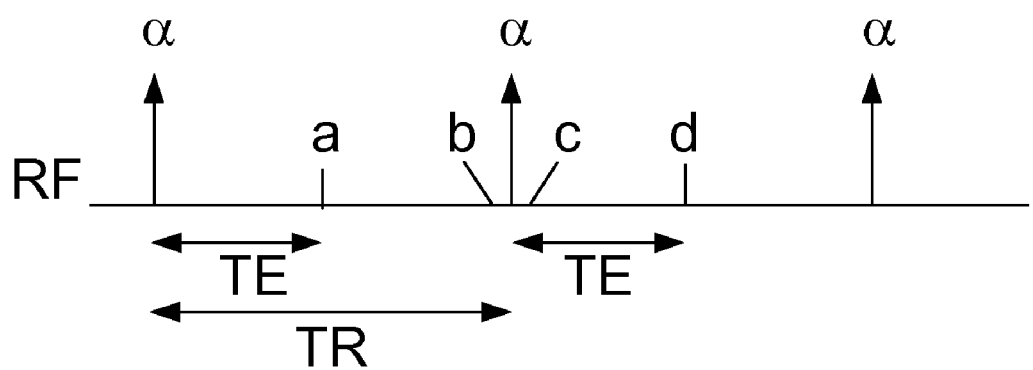

As illustrated in FIGS. 1 and 2, a conventional refocused SSFP sequence includes a single RF excitation, which is repeated periodically. All gradients used for slice selection or imaging are fully rewound over each repetition time, TR. In the steady-state, the magnetization at points a and d is the same.

Magnetization is tipped about a traverse axis through an angle $\alpha$. Between excitations, the magnetization undergoes a precession by an angle $\theta=2\pi\Delta f TR$ about the z-axis, where $\Delta f$ is the tissue off-resonance, and also experiences both T1 and T2 relaxation.

During the sequence, RF pulses, relaxation and free precession affect each spin. The steady-state magnetization for SSFP is a function of the sequence parameters: flip angle ($\alpha$), repetition time (TR) and echo time (TE), as well as the tissue parameters: T1, T2, and resonance frequency offset: $\Delta f$.

All imaging gradients are rewound, and the low spatial frequency-information is acquired at an echo time (TE) midway between RF excitation pulses. The steady-state signal that arises after many repetitions is strong function of resonance frequency, exhibiting a characteristic pattern that repeats every 1/TR Hz.

Figure 3A:
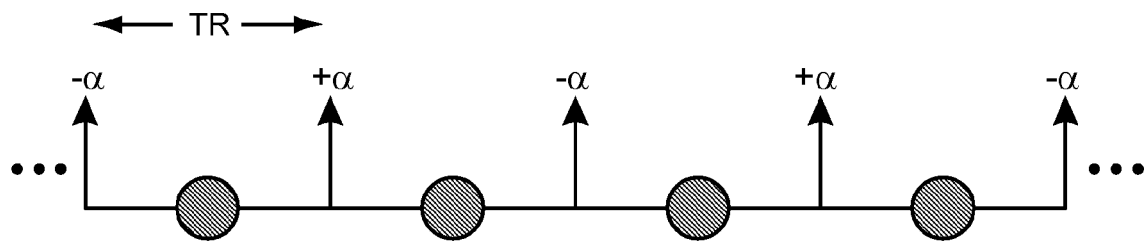
FIGS. 3A, 3B illustrate conventional SSFP pulse sequences and pulse sequences in accordance with an embodiment of the inventions, respectively.
Figure 3B:
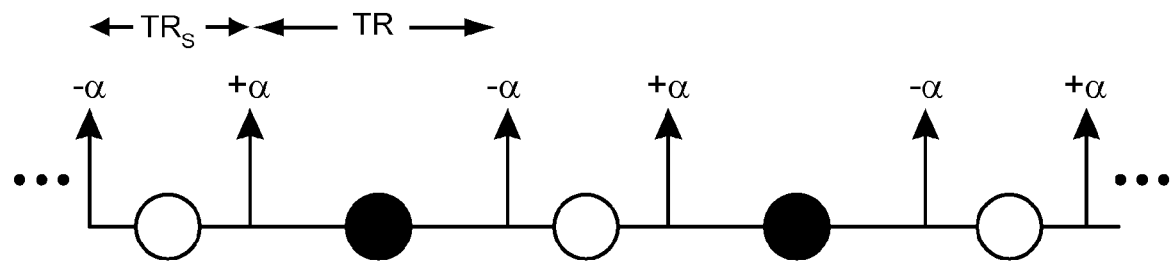

Balanced steady-state free precession (SSFP) imaging consists of rapidly repeating the FIG. 1 sequence of excitations and acquisitions as shown in FIG. 3. Excitations (illustrated with vertical arrows) consist of an RF pulse and fully-rewound slice-select gradient. Acquisitions (illustrated with small circles) consist of fully-rewound imaging gradients and a period of data acquisition. The SSFP signal is highly sensitive to resonance frequency, but provides superior SNR and image quality compared to gradient echo techniques. SSFP image contrast is also predominantly based on T2/T1, which provides high blood and lipid signal, and low myocardial signal. This combination has been shown to be useful in many cardiac applications.

Figure 4:
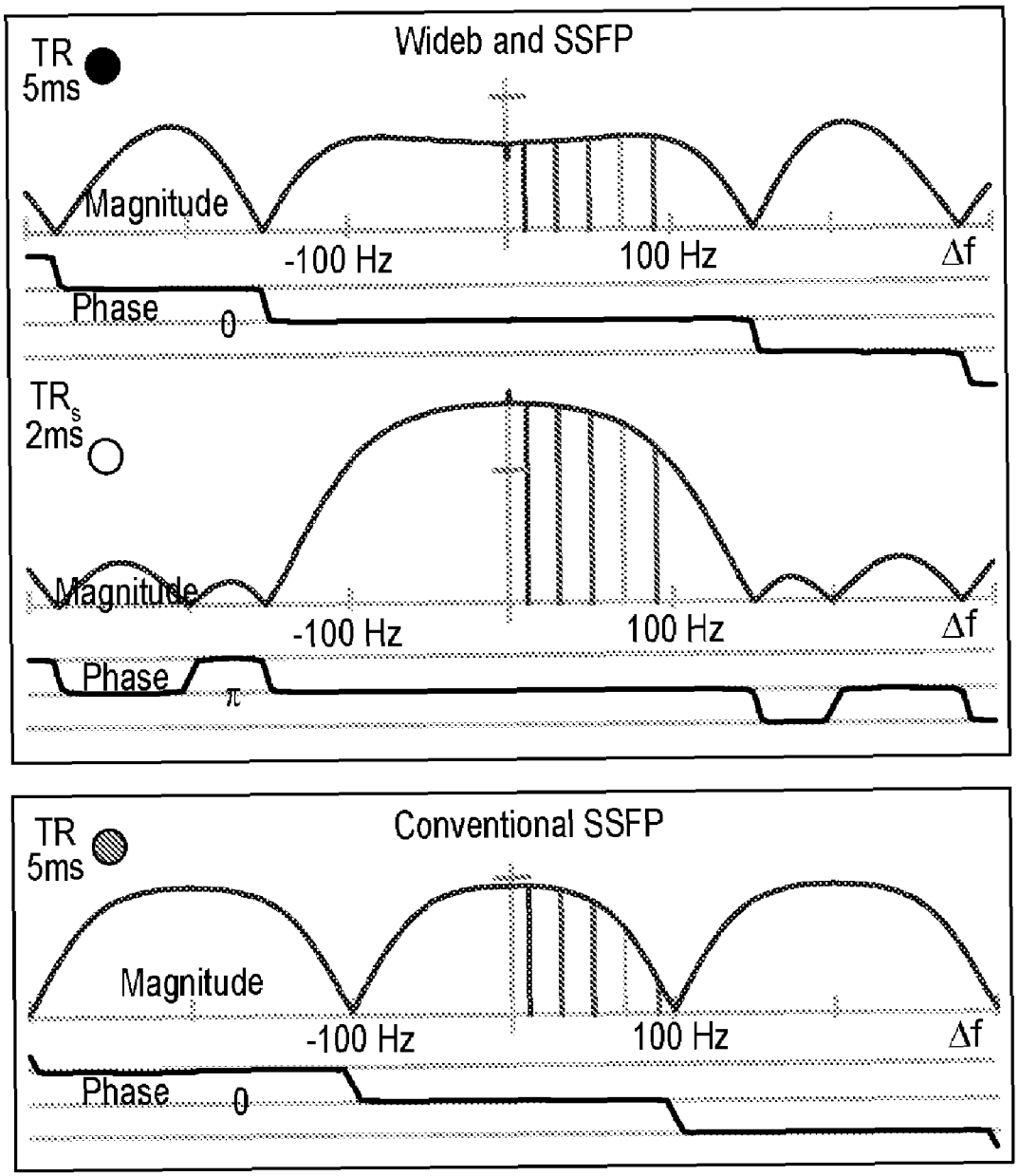
FIG. 4 illustrates wideband SSFP and conventional SSFP signal as a function of resonance frequency. ($T_1/T_2$=1000/300 ms, $\alpha$=70°). The usable bandwidth in standard SSFP (TR=5 ms) is less than the 1/TR. The usable bandwidth with Wideband SSFP (TR=5 ms, $TR_s$=2 ms) is 60% greater.

The new technique, in accordance with the invention and called Wideband SSFP, uses two alternating repetition times (shown in FIG. 3). As a result, two distinctly different echoes are formed (indicated by the black and white circles). A spin with resonance frequency $\Delta f$ will precess by different amounts during the two intervals, and will have an asymmetric steady state. FIG. 4 compares the signal vs. frequency profiles of each of the two echoes of Wideband SSFP with standard balanced SSFP. This steady state has a wider and flatter signal passband compared to conventional SSFP, making it suitable for imaging situations where susceptibility variations would otherwise prevent the use of balanced SSFP.

Figure 5:
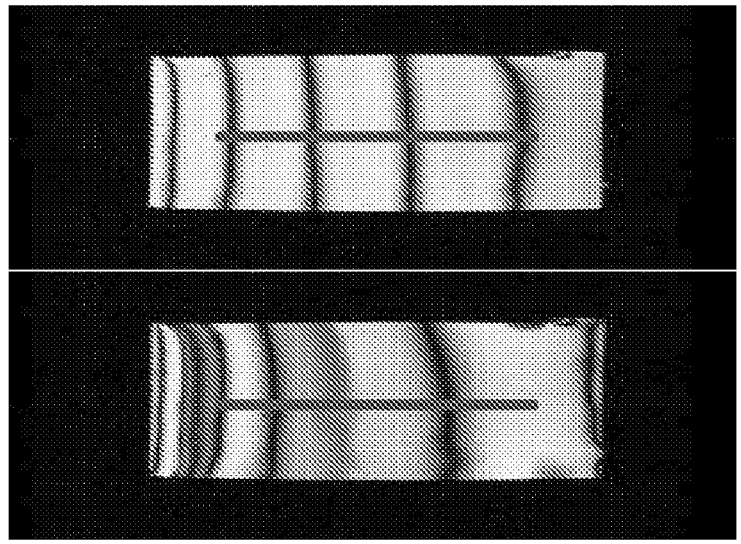
FIG. 5 illustrates Measured signal profiles from a uniform block phantom (T1,T2≈100 ms) at 1.5 T, with a linear x-shim, TR=6 ms, and (gray) conventional SSFP with $TR_s$=TR and (blue) Wideband SSFP with $TR_s$=TR/2. A 60% bandwidth improvement is observed. The signal dip in the Wideband SSFP profile is presumably due to the short T1,T2 of the test object.
Figure 5:
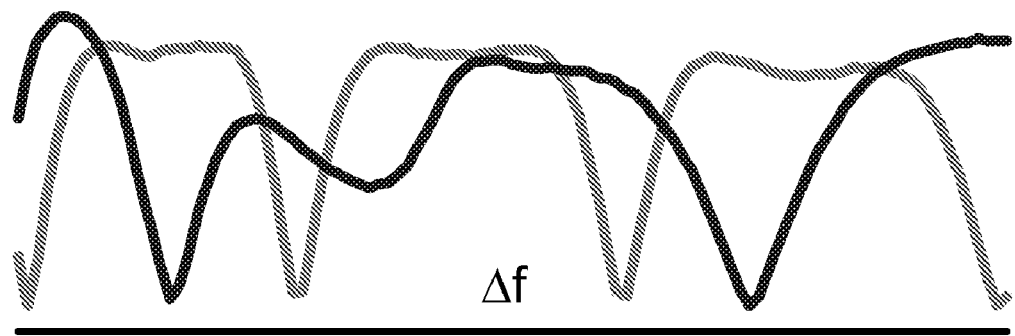

An initial experiment was performed on a GE Signa 1.5 T scanner using a slab phantom containing doped water with T1,T2≈100 ms, and a 2D Wideband SSFP sequence. A linear shim was applied along one in-plane direction in order to measure the spectral response from a single image. FIG. 5 contains measured signal profiles when $TR_s=TR$ and when $TR_s=TR/2$. The expected 60% bandwidth improvement is observed. The wide "signal dip" in the Wideband SSFP profile is presumably due to the short T1 and T2 of the test object.

Wideband SSFP increases the available signal bandwidth for a given time between RF pulses, TR, but using alternating times TR and $TR_s$. There are significant advantages of this compared with standard balanced SSFP, summarized as follows:

Increased Spatial Resolution: Wideband SSFP can achieve the same desired minimum bandwidth between signal nulls as standard SSFP while allowing much more time between excitation pulses. In MRI, to achieve a given spatial resolution requires some minimum imaging "readout time." Because of the greater time between excitation pulses, greater spatial resolution can be achieved.

Increased Temporal Resolution: As described above, Wideband SSFP can achieve a desired minimum bandwidth with greater imaging "readout time." The longer readout window can be used to acquire a greater portion of k-space during each TR, for example using spiral or echo-planar trajectories. As such, fewer TRs will be required to form an image, and temporal resolution can be improved.

Increased Signal Bandwidth: This is the opposite of the last two points—for a given time between RF pulses, the signal bandwidth is increased. The result is that the presence of dark signal bands due to the signal nulls can be significantly decreased. This is of particular importance when imaging near large susceptibility variations, such as in the brain or chest.

Enables High Field SSFP: The effect of susceptibility variations is a frequency variation that is proportional to the static magnetic field strength. However, imaging gradient performance does not change at high field. Thus standard balanced SSFP is more difficult at high field (3.0 T and higher) than at 1.5 T because of limited signal bandwidth. By increasing the signal bandwidth, Wideband SSFP enables SSFP imaging at high field for applications where standard balanced SSFP will not work.

The basic Wideband SSFP sequence is a simple modification to standard balanced SSFP whereby the time between excitations alternates between TR and $TR_s$. There are several considerations and options to best implement this technique, described in the following sections.

It is common in MRI to use a low-resolution "field map" to measure the frequency variations that result from static field inhomogeneity, susceptibility effects and center frequency errors. Because they are typically very low resolution, the time needed for field map acquisitions is not usually as long as that required for image acquisition. Thus the idea of using the shorter TR to obtain a field map while the longer TR is used for imaging may significantly improve sequence efficiency.

To mitigate the effects of patient motion, navigator echoes are often included in the sequence to track motion. Like field map acquisitions, navigators are quick to acquire, but need to be acquired frequently, at similar times to the image data that they are used to correct. A useful modification to Wideband SSFP is to use the shorter TR to acquire a navigator echo while the longer TR is used for regular image acquisition. As with the field map acquisition above, this will improve scan efficiency.

Numerous publications have described methods to "catalyze" the steady state in balanced SSFP. As a fully-refocused sequence, Wideband SSFP will suffer similarly long transients as the steady state is achieved. However, careful design of a catalyzing sequence of tip pulses (using, for example, methods such as) will allow more rapid manipulation of magnetization toward the steady state. For Wideband SSFP, even single-tip catalyzation is expected to be quite robust, because in the steady state, magnetization vectors are close in magnitude to Mo, and at the imaging echo (middle of TR), the magnetization vector is close to the longitudinal axis. Catalyzation will help with the idea of combining Wideband SSFP with magnetization preparation sequences such as T2-prep fat-saturation, myocardial tagging or inversion recovery.

The signal level during $TR_s$ is higher than during TR, and therefore combining data from both echoes to form a single image, can potentially improve overall image SNR. For example, low spatial frequency information (which requires very short readout time) could be acquired during $TR_s$, and full spatial frequency information could be acquired during TR.

The basic Wideband SSFP sequence that we have described uses the same excitation pulses at the start of both excitation intervals. However, there is significant flexibility in the RF pulse design. As an example, if $TR_s$ is not used for imaging, then $TR_s$ can be significantly shortened by combining gradients from successive RF pulses. Alternatively, this time saving could be traded for improved slice profiles to improve the contrast uniformity across the slice or RF pulse shaping to reduce RF heating of tissue.

The basic requirements for implementation of this method include a standard balanced SSFP (FIESTA, TrueFISP, or balanced-FFE) imaging sequence, the ability to set two different repetition times, and standard shimming techniques.

There has been described a new invention called Wideband SSFP, wherein a standard balanced SSFP MRI sequence is played with repetition times of alternating lengths, TR and $TR_s$, where $TR_s<TR$. The result is significantly improved tradeoff between signal bandwidth and available acquisition interval lengths. This is particularly important as it enables the combination of balanced SSFP with high field imaging for many applications such as cardiac, musculoskeletal and abdominal imaging.

While the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A method of magnetic resonance imaging using steady state free precession (SSFP) with increased signal bandwidth and image resolution comprising the steps of:
    a) applying a SSFP pulse sequence including an excitation pulse repetitively and with different alternating repetition times to attain different steady state signals, which comprise a signal with a longer repetition time and a signal with a shorter repetition time,
    b) detecting the different steady state signals with the signal with the longer repetition time having a broader bandwidth and flatter response compared to conventional SSFP, thereby providing images where susceptibility variations are present, and
    c) providing an image and a functional element using the detected signals.

2. The method of claim 1 wherein two repetition times are alternated.

3. The method of claim 2 wherein the excitation pulses for the two repetition times have opposite polarity.

4. The method of claim 3 wherein the excitation pulses are identical except for polarity or modulation phase.

5. The method of claim 3 wherein the excitation pulses are different.

6. The method of claim 3 wherein a detected signal from a larger of the two repetition times is used for providing an image.

7. The method of claim 6 wherein a detected signal from a shorter of the two repetition times is used for acquiring a field map.

8. The method of claim 6 wherein the excitation pulses for the two repetition times comprise catalyzing sequences.

9. The method of claim 3 wherein the excitation pulses for the two repetition times comprise catalyzing sequences.

10. The method of claim 1 wherein the repetition times are varied.

11. The method of claim 1, wherein the signal with the shorter repetition time has a broader bandwidth and flatter response compared to conventional SSFP.

12. A method of increasing bandwidth and signal magnitude of a steady state free precession (SSFP) signal in magnetic resonance imaging comprising the steps of:
    a) providing a SSFP pulse sequence including an excitation RF pulse,
    b) applying the SSFP pulse sequence repetitively with two different alternating repetition times ($TR$, $TR_s$) which are varied to attain two different steady state signals with increased bandwidth as compared to the bandwidth of a steady state signal attained with only one of the two repetition times, and
    c) detecting and combining the two steady state signals.

13. The method of claim 12 wherein the excitation RF pulses for the two repetition times have opposite polarity.

14. The method of claim 13 wherein the excitation RF pulses are identical except for polarity.

15. The method of claim 13 wherein the excitation pulses for the two repetition times are different.

* * * * *

UNITED STATES PATENT AND TRADEMARK OFFICE
CERTIFICATE OF CORRECTION

PATENT NO.       : 7,332,908 B2               Page 1 of 1
APPLICATION NO.  : 11/381601
DATED            : February 19, 2008
INVENTOR(S)      : Nayak et al.

It is certified that error appears in the above-identified patent and that said Letters Patent is hereby corrected as shown below:

In The Specification Under Column 1:

• Please replace lines 7-14 with:

-- This invention was made with Government support under contracts HL074332, EB002524, HL067161, HL075803, and HL039297 awarded by the National Institutes of Health. The Government has certain rights in this invention. This invention was also supported by the American Heart Association grant no. 0435249N awarded to the University of Southern California. --

Signed and Sealed this
Nineteenth Day of April, 2011

David J. Kappos
*Director of the United States Patent and Trademark Office*